US012672233B2

(12) United States Patent
Min et al.

(10) Patent No.: US 12,672,233 B2
(45) Date of Patent: Jun. 30, 2026

(54) PRINTED CIRCUIT BOARD AND MANUFACTURING METHOD THEREOF

(71) Applicant: SAMSUNG ELECTRO-MECHANICS CO., LTD., Suwon-si (KR)

(72) Inventors: Jun Ki Min, Suwon-si (KR); Seong Ho Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 91 days.

(21) Appl. No.: 18/203,294

(22) Filed: May 30, 2023

(65) Prior Publication Data

US 2024/0074050 A1 Feb. 29, 2024

(30) Foreign Application Priority Data

Aug. 29, 2022 (KR) ........................ 10-2022-0108573

(51) Int. Cl.
| | |
|---|---|
| *H05K 1/11* | (2006.01) |
| *H05K 1/02* | (2006.01) |
| *H05K 1/18* | (2006.01) |
| *H05K 3/40* | (2006.01) |
| *H05K 3/46* | (2006.01) |
| *H05K 1/181* | (2026.01) |

(52) U.S. Cl.
CPC ........... *H05K 1/111* (2013.01); *H05K 3/4007* (2013.01); *H05K 3/4644* (2013.01); *H05K 1/0256* (2013.01); *H05K 1/116* (2013.01); *H05K 1/181* (2013.01); *H05K 2201/09036* (2013.01); *H05K 2201/09481* (2013.01)

(58) Field of Classification Search
None
See application file for complete search history.

(56) References Cited

U.S. PATENT DOCUMENTS

| | | | | |
|---|---|---|---|---|
| 7,847,198 B2* | 12/2010 | Shimoishizaka | ....... | H01L 24/12 |
| | | | | 174/267 |
| 10,602,621 B1* | 3/2020 | Hu | ........................ | H05K 3/4007 |
| 2016/0021744 A1* | 1/2016 | Baek | ................ | H01L 23/49811 |
| | | | | 174/250 |
| 2016/0242285 A1* | 8/2016 | Katsuno | ................. | H05K 3/244 |
| 2017/0127517 A1* | 5/2017 | Ishihara | ............. | H01L 23/5389 |

FOREIGN PATENT DOCUMENTS

| | | |
|---|---|---|
| JP | 2015-195308 A | 11/2015 |
| KR | 10-2019-0124503 A | 11/2019 |

OTHER PUBLICATIONS

Office Action dated Dec. 9, 2025 of the corresponding Korean Patent Application No. 10-2022-0108573 with English translation.

* cited by examiner

*Primary Examiner* — Ishwarbhai B Patel
(74) *Attorney, Agent, or Firm* — Morgan, Lewis & Bockius LLP

(57) ABSTRACT

A printed circuit board according to an embodiment includes: an insulation layer including a recess portion; and a connection pad disposed on the recess portion of the insulation layer and protruded from the recess portion, wherein the connection pad may include a protrusion and a concave portion that is lower than the protrusion, and a surface height of the protrusion of the connection pad may be substantially the same as or less than a surface height of the insulation layer.

9 Claims, 11 Drawing Sheets

PRINTED CIRCUIT BOARD AND MANUFACTURING METHOD THEREOF

CROSS-REFERENCE TO RELATED APPLICATION

This application claims priority to and the benefit of Korean Patent Application No. 10-2022-0108573 filed in the Korean Intellectual Property Office on Aug. 29, 2022, the entire contents of which are incorporated herein by reference.

TECHNICAL FIELD

The present disclosure relates to a printed circuit board and a manufacturing method thereof.

BACKGROUND

A printed circuit board is a formation of a circuit pattern with a conductive material such as copper on an insulator, and recently, printed circuit boards with an embedded pattern structure in which a circuit pattern is embedded in the insulator are in use to respond to trends of downsizing and slimming electronic parts.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a printed circuit board for improving accessibility with installed parts and a manufacturing method thereof.

The object of this disclosure is not limited to the above-described object, and it may be expanded in various ways in the range of the ideas and the areas of this disclosure.

An embodiment provides a printed circuit board including: an insulation layer including a recess portion; and a connection pad disposed in the recess portion of the insulation layer and protruded from a bottom side of the recess portion, wherein the connection pad may include a protrusion and a concave portion that is lower than the protrusion, and a surface height of the protrusion of the connection pad may be substantially the same as or less than a surface height of the insulation layer.

The protrusion of the connection pad may be disposed in a center portion of the connection pad, and the concave portion may surround the protrusion.

A cross-section of the protrusion may have a trapezoidal shape of which a width is narrowed as it goes upward.

A surface of the concave portion may be substantially planar.

A surface height of the concave portion of the connection pad may be higher than a height of the bottom side of the recess portion and may be lower than a surface height of the insulation layer.

A difference between the surface height of the insulation layer and the surface height of the concave portion may be about 1 μm to about 6 μm.

The printed circuit of claim may further include a first protection layer covering a portion of one surface of the insulating layer, the recess portion being recessed from the one surface of the insulating layer.

The printed circuit of claim may further include a second protection layer covering another surface of the insulating layer opposing the one surface of the insulating layer.

Another embodiment provides a method for manufacturing a printed circuit board, including: forming a substrate including a plurality of insulation layers, a plurality of circuit pattern layers embedded among the insulation layers, and a thin film metal layer disposed on the insulation layer and contacting a first circuit pattern layer from among the plurality of circuit pattern layers; forming a plurality of etching resist patterns on the thin film metal layer of the substrate; etching a part of the thin film metal layer and the first circuit pattern layer by using the plurality of etching resist patterns as an etching mask; removing the plurality of etching resist patterns; and etching the thin film metal layer including regions where the plurality of etching resist patterns are removed.

The plurality of etching resist patterns may be formed on a position where a plurality of connection pads are formed.

The plurality of connection pads may be formed by etching the part of the thin film metal layer and the first circuit pattern layer and by etching of the thin film metal layer including the regions where the plurality of etching resist patterns are removed.

The plurality of connection pads may be formed in a plurality of recess portions of the insulation layers, respectively.

One of the connection pads may be formed to include a protrusion and a concave portion that is lower than the protrusion.

A surface height of the protrusion of the one of plurality of connection pads may be formed to be substantially the same as or less than a surface height of the insulation layer.

The protrusion of the one of the plurality of connection pads may be formed to be disposed in a center portion of the one of the plurality of connection pads, and the concave portion may be formed to surround the protrusion.

A cross-section of the protrusion may have a trapezoidal shape of which a width is narrowed as it goes upward.

A surface of the concave portion may be substantially planar.

A surface height of the concave portion of the one of the plurality of connection pads may be formed to be higher than a height of a bottom side of one of the plurality of recess portions and lower than a surface height of the insulation layer.

According to the embodiments, the printed circuit board for improving accessibility with installed parts and the manufacturing method thereof may be provided.

The object of this disclosure is not limited to the above-described object, and it may be expanded in various ways in the range of the ideas and the areas of this disclosure.

DETAILED DESCRIPTION

Figure 1:
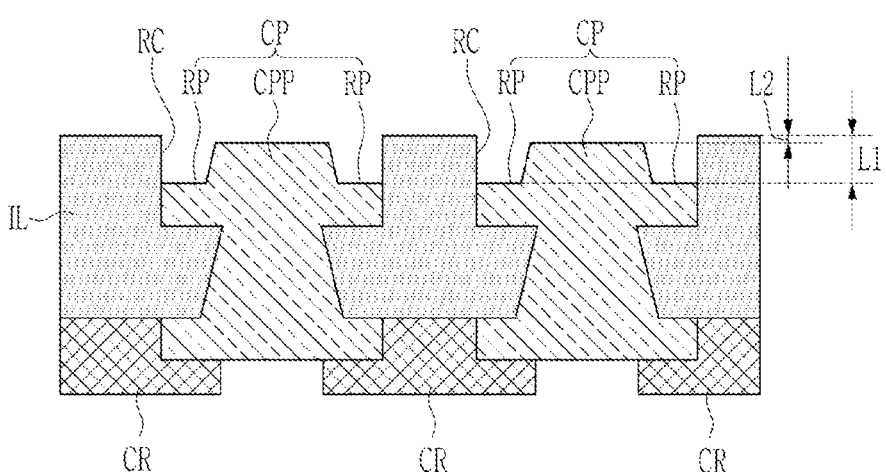
FIG. 1 shows a cross-sectional view of a printed circuit board according to an embodiment.

The embodiments will be described more fully hereinafter with reference to the accompanying drawings, in which embodiments are shown. As those skilled in the art would realize, the described embodiments may be modified in various different ways, all without departing from the spirit or scope of the embodiments.

Parts that are irrelevant to the description will be omitted to clearly describe the embodiments, and the same elements will be designated by the same reference numerals throughout the specification.

The accompanying drawings are provided only in order to allow embodiments disclosed in the present specification to be easily understood and are not to be interpreted as limiting the spirit disclosed in the present specification, and it is to be understood that the embodiments include all modifications, equivalents, and substitutions without departing from the scope and spirit of the embodiments.

The size and thickness of each configuration shown in the drawings are arbitrarily shown for better understanding and ease of description, but the embodiments are not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

When it is described that a part is "connected" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Various embodiments and variations will now be described with reference to accompanying drawings.

A printed circuit board according to an embodiment will now be described with reference to FIG. 1. FIG. 1 shows a cross-sectional view of a printed circuit board according to an embodiment.

Referring to FIG. 1, the printed circuit board according to the present embodiment may include an insulation layer IL including a plurality of recess portions RC, a plurality of connection pads CP positioned in a recess portion RC of the insulation layer IL and exposed from the recess portion RC, and a protection layer CR for covering part of the insulation layer IL and protecting the same.

Surface heights of the connection pads CP may be substantially the same as or slightly less than a surface height of the insulation layer IL surrounding the respective connection pads CP.

The respective connection pads CP may include a protrusion CPP positioned in a center portion and relatively protruding, and a concave portion RP that is lower than the protrusion CPP.

The protrusion CPP of the respective connection pads CP may have a surface height substantially the same as or less than a surface height of the insulation layer IL, and the concave portion RP of the respective connection pads CP may be lower than the surface height of the insulation layer IL. For example, the concave portion RP of the respective connection pads CP may be lower than the surface height of the insulation layer IL by about 1 μm to about 6 μm. That is, a gap L1 between the surface height of the insulation layer IL and the surface height of the concave portion RP of the respective connection pads CP may be about 1 μm to about 6 μm. The meaning of the term "about" or "substantially" may include a process error occurring in the manufacturing process, a measurement error, or the like, recognizable by one of ordinary skill in the art. For example, being "about X" or "substantially X" in which "X" is a term may mean being exactly "X" or may include a tolerable deviation from "X" due to a process error occurring in the manufacturing process, a measurement error, or the like, recognizable by one of ordinary skill in the art.

A difference L2 between the surface height of the protrusion CPP of the respective connection pads CP and the surface height of the insulation layer IL may be less than the gap L1.

As shown in FIG. 1, a cross-section of the protrusion CPP of the connection pads CP may have a trapezoidal shape of which a width is narrowed as it goes upward.

The surfaces of concave portions RP of the connection pads CP may be substantially planar.

As described above, according to the printed circuit board according to an embodiment, the respective connection pads CP may be positioned in the recess portion RC of the insulation layer IL, the respective connection pads CP may include a protrusion CPP and a concave portion RP, and the surface height of the protrusion CPP of the respective connection pads CP may be higher than the surface height of the concave portion RP.

Therefore, the height difference between the respective connection pads CP and the insulation layer IL is small when compared to the case in which the respective connection pads CP include no protrusion CPP, thereby improving accessibility between the connection pads CP and external electronic parts.

A method for manufacturing a printed circuit board according to an embodiment will now be described with reference to FIG. 2 to FIG. 10 together with FIG. 1. FIG. 2 to FIG. 10 show a method for manufacturing a printed circuit board according to an embodiment.

Figure 2:
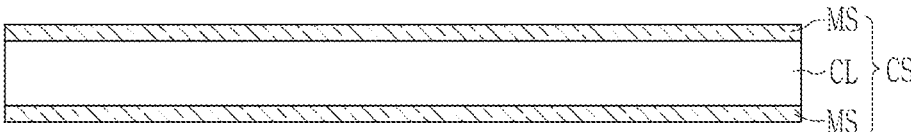
FIG. 2 to FIG. 11 show a method for manufacturing a printed circuit board according to an embodiment.

Referring to FIG. 2, a carrier substrate CS including a core portion CL and a thin film metal layer MS stacked on respective sides of the core portion CL is provided.

Figure 3:
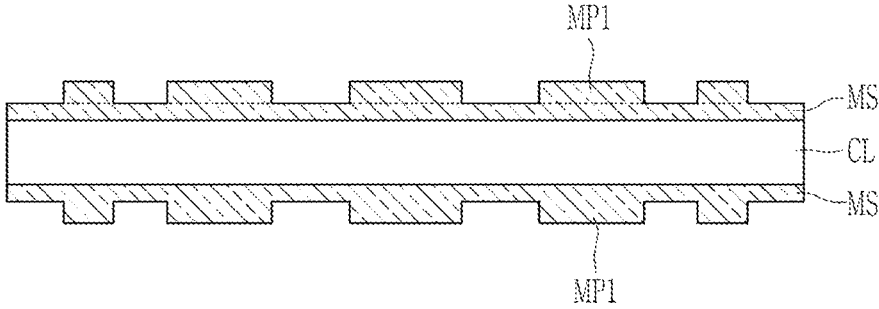

Referring to FIG. 3, a first circuit pattern layer MP1 is formed on the carrier substrate CS. In this instance, a plated resist is stacked on the thin film metal layer MS of the carrier substrate CS and is then exposed and developed to form a plated resist pattern on a portion on which a first circuit pattern layer MP1 will be formed, and a conductive metal is stacked on a portion on which the plated resist pattern is not formed, and thereby a first circuit pattern layer MP1 is formed.

The first circuit pattern layer MP1 may be connected to the thin film metal layer MS of the carrier substrate CS, and may include a same metal as that of the thin film metal layer MS. For example, the thin film metal layer MS and the first circuit pattern layer MP1 may include copper (Cu).

Figure 4:
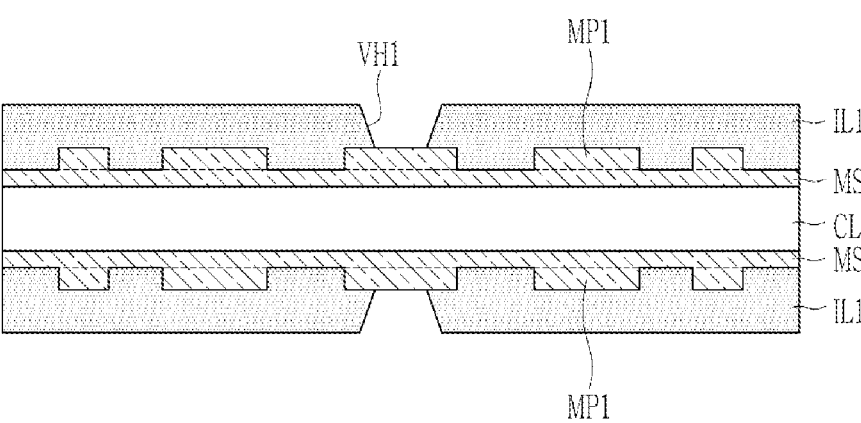

Referring to FIG. 4, the first insulation layer IL1 is stacked on the first circuit pattern layer MP1 to embed the first circuit pattern layer MP1 in the first insulation layer IL1. The first insulation layer IL1 may include a resin insulation layer. The first insulation layer IL1 may use a thermo-curable resin such as an epoxy resin, a thermoplastic resin such as a polyimide, or a resin, e.g., a prepreg, to which a reinforcing member such as glass fibers or an inorganic filler is impregnated, and may include a thermo-curable resin and/or a photocurable resin, and it is not limited thereto.

Further, a first via hole VH1 for exposing part of the first circuit pattern layer MP1 may be formed in the first insulation layer IL1.

Figure 5:
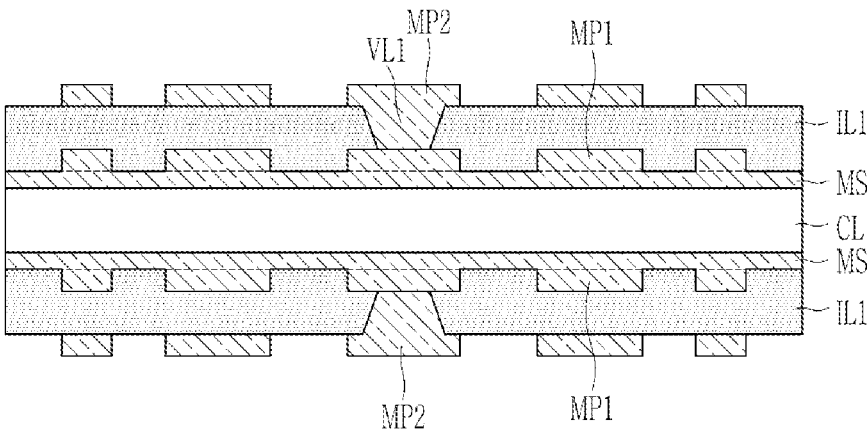

As shown in FIG. 5, a second circuit pattern layer MP2 may be formed on the first insulation layer IL1. The second circuit pattern layer MP2 may be formed by a method that is similar to that of the first circuit pattern layer MP1. The second circuit pattern layer MP2 may include a same material as the first circuit pattern layer MP1.

Further, a first via layer VL1 may be formed in the first via hole VH1.

Figure 6:
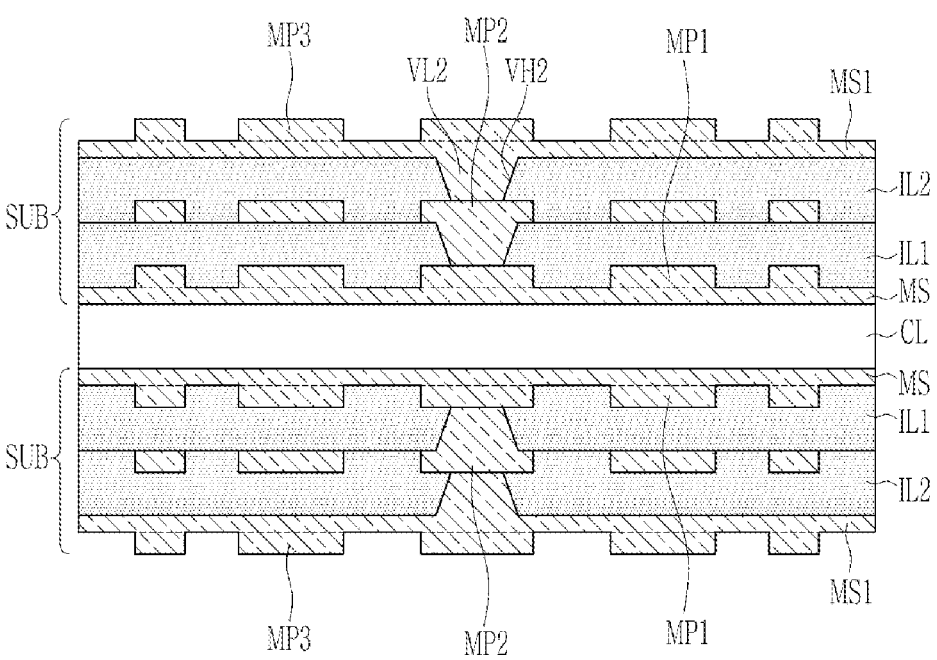

As shown in FIG. 6, the second insulation layer IL2 is stacked on the second circuit pattern layer MP2 to embed the second circuit pattern layer MP2 in the second insulation layer IL2, and a metal layer MS1 and a third circuit pattern layer MP3 are formed on the second insulation layer IL2 to complete the substrate SUB on respective sides of the core portion CL.

Further, a second via hole VH2 for exposing part of the second circuit pattern layer MP2 may be formed in the second insulation layer IL2 and a second via layer VL2 may be formed in the second via hole VH2. According to the shown embodiment, the second via hole VH2 and the first via hole VH1 may be overlap each other, however the embodiment may be not limited thereto.

According to the shown embodiment, the substrate SUB is shown to include the first insulation layer IL1 and the second insulation layer IL2 that are two insulation layers, and the first circuit pattern layer MP1, the second circuit pattern layer MP2, and the third circuit pattern layer MP3 that are three metal layers, and without being limited thereto, it may include a greater number of insulation layers and circuit patterns.

Figure 7:
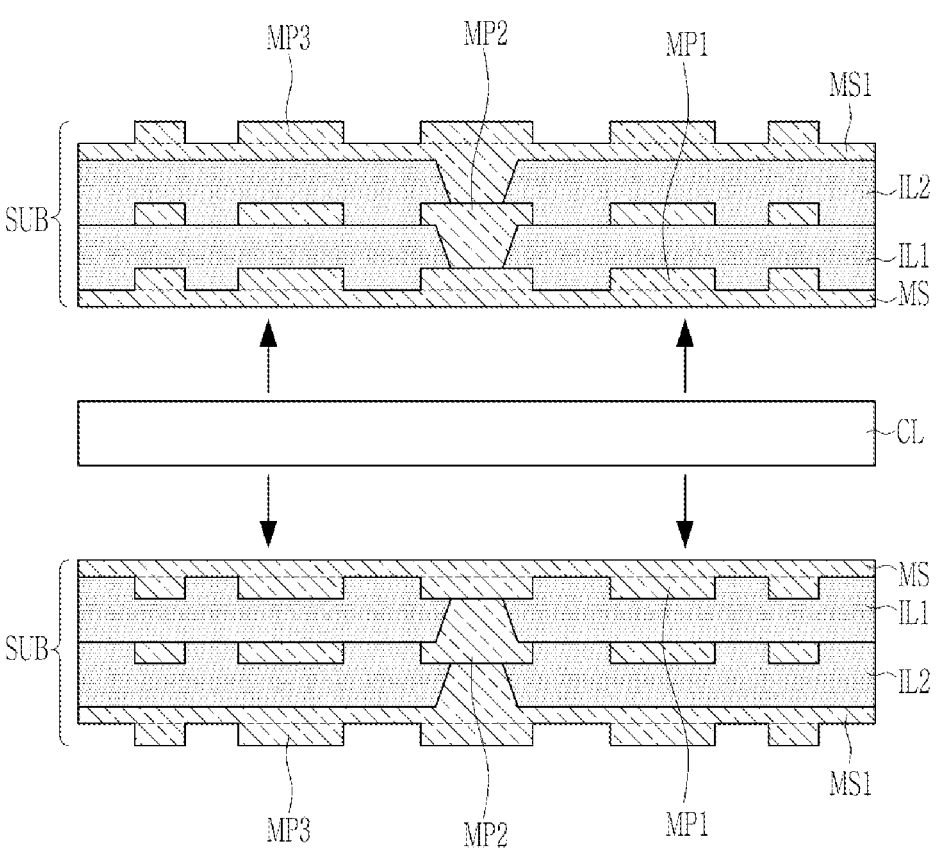

As shown in FIG. 7, the substrate SUB is peeled off from respective sides of the core portion CL.

Figure 8:
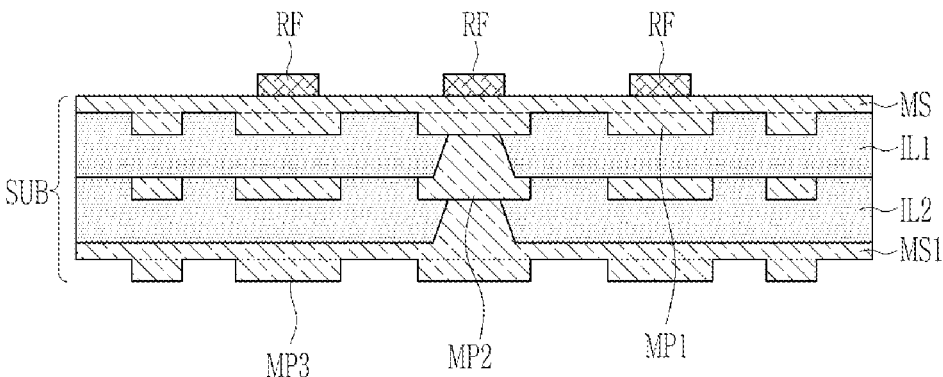

Referring to FIG. 8, an etching resist pattern RF is formed on the thin film metal layer MS of the substrate SUB peeled off from the core portion CL.

The etching resist pattern RF may formed on a position where the connection pad CP will be formed.

The etching resist pattern RF may stack a resist layer on the thin film metal layer MS of the substrate SUB and may perform exposure and development so that the resist layer may remain at the position where the connection pad CP will be formed.

Figure 9:
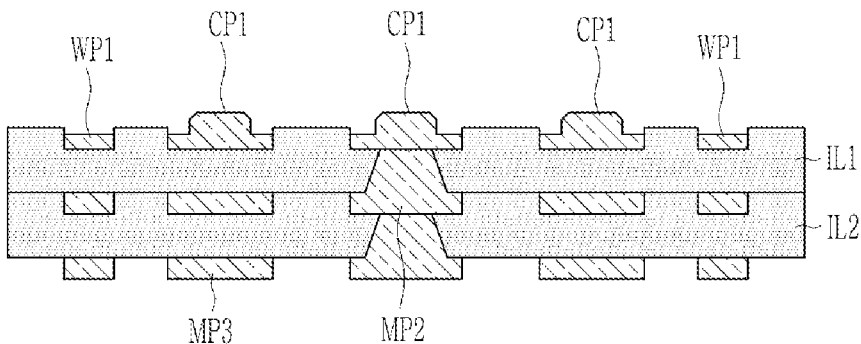

Part of the thin film metal layer MS and the first circuit pattern layer MP1 provided therebelow are removed by using the etching resist pattern RF as an etching mask to thus form a plurality of preliminary wiring layers WP1 and a plurality of preliminary connection pads CP1 and remove the etching resist pattern RF, as shown in FIG. 9.

The preliminary connection pad CP1 may include a concave portion and a protrusion protruding further than the concave portion, and a surface height of the concave portion may be lower than the surface height of the first insulation layer IL1.

Figure 10:
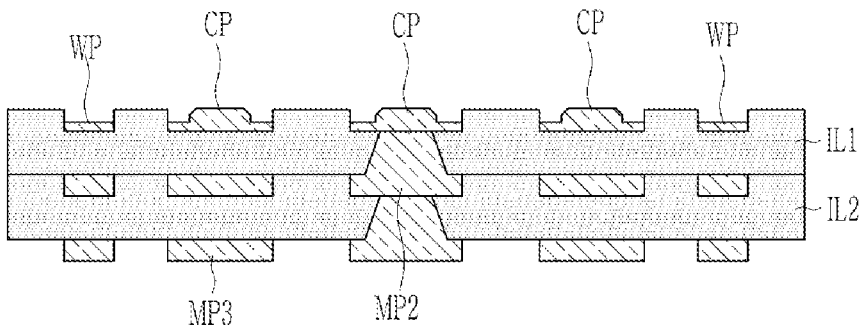

For a following process, the preliminary wiring layers WP1 and the preliminary connection pads CP1 overlapping the etching resist pattern RF may be additionally etched, and by this, as shown in FIG. 10, a plurality of wiring layers WP that are embedded in the first insulation layer IL1 and do not protrude therefrom are formed, and may simultaneously form a plurality of connection pads CP in which the protrusion has substantially the same or a lower surface height as/than the first insulation layer IL1, and the surface height of the concave portion is lower than the surface of the first insulation layer IL1.

Figure 11:
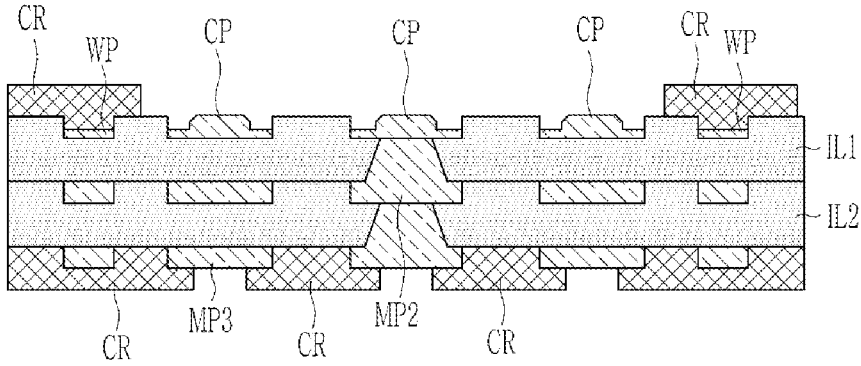

As shown in FIG. 11, a protection layer CR may be formed on part of the first insulation layer IL1 and the second insulation layer IL2.

The protection layer CR may not be positioned on a portion overlapping a plurality of connection pads CP. The protection layer CR may be a solder resist.

As described, according to the method for manufacturing a printed circuit board according to an embodiment, the etching resist pattern RF is formed on the thin film metal layer MS of the substrate SUB, the thin film metal layer MS is etched by using the etching resist pattern RF as an etching mask, and the first circuit pattern layer MP1 is additionally etched so a plurality of wiring layers WP that are embedded in the insulation layer and do not protrude above the insulation layer, and a plurality of connection pads CP including a protrusion that has substantially the same surface height as the insulation layer and a concave portion that has a lower surface height than the surface of the insulation layer may be formed.

By this, the respective connection pads CP may include the protrusion CPP and the concave portion RP, and the surface height of the protrusion CPP of the respective connection pads CP may be higher than the surface height of the concave portion RP.

As the respective connection pads CP include the protrusion CPP, the height differences between the respective connection pads CP and the insulation layer IL are less so the accessibility between the connection pads CP and the external electronic parts may be improved.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A printed circuit board comprising: an insulation layer including a recess portion; and a connection pad disposed in the recess portion of the insulation layer and protruded from a bottom side of the recess portion, wherein the connection pad includes a protrusion and a concave portion that is lower than the protrusion, a surface height of the protrusion of the connection pad is less than a surface height of the insulation layer; wherein the connection pad is exposed in the cavity; wherein the protrusion of the connection pad is disposed in a center portion of the connection pad, and the concave portion surrounds the protrusion; and wherein a cross-section of the protrusion has a trapezoidal shape of which a width is narrowed as it goes upward.

2. The printed circuit of claim 1, wherein a surface of the concave portion is substantially planar.

3. The printed circuit of claim 2, wherein a surface height of the concave portion of the connection pad is higher than a height of the bottom side of the recess portion and is lower than a surface height of the insulation layer.

4. The printed circuit of claim 3, wherein
a difference between the surface height of the insulation
   layer and the surface height of the concave portion is
   about 1 μm to about 6 μm.

5. The printed circuit of claim 1, wherein
a cross-section of the protrusion has a trapezoidal shape of
   which a width is narrowed as it goes upward.

6. The printed circuit of claim 5, wherein
a surface of the concave portion is substantially planar.

7. The printed circuit of claim 6, wherein
a surface height of the concave portion of the connection
   pad is higher than a height of the bottom side of the
   recess portion and is lower than a surface height of the
   insulation layer.

8. The printed circuit of claim 1, further comprising:
a first protection layer covering a portion of one surface
   of the insulating layer, the recess portion being recessed
   from the one surface of the insulating layer.

9. The printed circuit of claim 8, further comprising:
a second protection layer covering another surface of the
   insulating layer opposing the one surface of the insu-
   lating layer.

* * * * *